(12) United States Patent
Conboy et al.

(10) Patent No.: US 6,440,821 B1
(45) Date of Patent: Aug. 27, 2002

(54) METHOD AND APPARATUS FOR ALIGNING WAFERS

(75) Inventors: Michael R. Conboy; Elfido Coss, Jr., both of Austin; Sam H. Allen, New Braunfels, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/783,419

(22) Filed: Feb. 14, 2001

(51) Int. Cl.[7] .................... H01L 21/46; H01L 21/78; H01L 21/301
(52) U.S. Cl. ......................... 438/462; 438/401
(58) Field of Search .................... 438/108, 124, 438/401, 460, 462, 703, 464, 975

(56) References Cited

U.S. PATENT DOCUMENTS

| | | | | |
|---|---|---|---|---|
| 4,914,601 A | * | 4/1990 | Smyth, Jr. ................. | 364/490 |
| 4,918,320 A | * | 4/1990 | Hamasaki et al. .......... | 250/548 |
| 5,545,570 A | * | 8/1996 | Chung et al. ............... | 438/703 |
| 5,923,996 A | * | 7/1999 | Shih et al. .................. | 438/462 |
| 6,268,740 B1 | * | 7/2001 | Iida ............................. | 324/765 |
| 6,275,742 B1 | * | 8/2001 | Sagues et al. .............. | 700/213 |

* cited by examiner

Primary Examiner—David Nelms
Assistant Examiner—Phuc T. Dang
(74) Attorney, Agent, or Firm—Williams, Morgan & Amerson, P.C.

(57) ABSTRACT

A method for aligning wafers includes defining a grid on a wafer; determining a grid offset parameter based on an offset between the grid and an external reference point defined on the wafer; and aligning the wafer based on the grid offset parameter and the external reference point. A system for aligning wafers includes a database server and a tool. The database server is adapted to store a grid offset parameter associated with a wafer. The grid offset parameter defines an offset between a grid defined on the wafer and an external reference point defined on the wafer. The tool is adapted to align the wafer based on the grid offset parameter associated with the wafer and the external reference point.

25 Claims, 4 Drawing Sheets

METHOD AND APPARATUS FOR ALIGNING WAFERS

BACKGROUND OF THE INVENTION

1. Field of the Invention

This invention relates generally to the field of semiconductor device manufacturing and, more particularly, to a method and apparatus for aligning wafers by determining an offset between a die grid and a reference point external to the die grid.

2. Description of the Related Art

During the manufacture of semiconductor devices, semiconductor wafers, each including a plurality of individual die, are subjected to a number of processing steps. Typically, wafers are grouped into lots that are processed together. Each lot may contain, for example, 25 individual wafers. Certain of the processing steps are sensitive to the alignment of the wafer within the processing tool. For example, photolithography processing steps are highly sensitive to the alignment of the wafer. Other steps, including metrology steps, are also sensitive to wafer alignment, but to differing degrees.

FIG. 1 illustrates a typical semiconductor wafer 100. The wafer 100 includes an orientation notch 110 useful as a reference point for a rough alignment of the wafer 100. For identification purposes, a unique wafer identification code 120 is scribed on the wafer 100 beneath the notch 110 using a laser scribing process where small dots are burned into the surface of the wafer to construct the characters or symbols of the code. Exemplary wafer identification codes 120 may include alphanumeric identifiers or bar code identifiers (e.g., 1 or 2 dimensional codes). During the production process, process history and metrology information is stored in a database for each of the wafers 100 indexed by its respective wafer identification code 120.

Typically, prior to performing an orientation-sensitive process, the wafer 100 is rotated until the notch 110 is located and placed in a predetermined position. Other techniques for performing rough alignments include using an edge alignment procedure where the wafer 100 is rotated and optically scanned to determine the profile of the edge at various positions about the rotation. Typically, a wafer 100 is not perfectly round. As such, the edge moves with respect to a fixed reference point as the wafer 100 is rotated. By determining the edge profile, the approximate center of the wafer 100 can be determined. The spatial relationship between the notch 110 and the approximate center point may be then used as a reference point for rough alignment of the wafer.

These rough alignment techniques are not suitable for highly sensitive processes such as photolithography. Accordingly, grid reference marks 130 are etched into the wafer 100 prior to the commencement of process steps for forming devices on the wafer 100. A wafer 100 typically includes a plurality of individual semiconductor die arranged in a grid 140. Photolithography steps are typically performed by a stepper on approximately one to four die locations at a time, depending on the specific photomask employed. The grid reference marks 130 are typically located in two designated cells of the grid 140 (i.e., functioning devices are not formed in the designated grid cells). The grid reference marks 130 provide an accurate reference point for aligning the stepper to the individual cells in the grid 140 that are to be exposed. The stepper includes sensitive optical scanning equipment to locate the grid reference marks 130 and finely align the wafer 100 based on the grid reference marks 130 such that the individual cell(s) are accurately patterned.

A typical process for forming the grid reference marks 130 includes forming an initial layer of photoresist, commonly referred to as the zero layer, on the wafer 100. The stepper receives the wafer 100 and performs a rough alignment using the notch and possibly a wafer edge alignment process. After the rough alignment, the stepper exposes the cells designated for the grid reference marks 130 to set the anchor points for the grid 140. The zero layer is then developed, the grid reference marks 130 are etched into the wafer 100, and the zero layer is removed. The stepper then uses the grid reference marks 130 to align all subsequent photolithography exposures.

While the grid reference marks 130 do provide an accurate means for aligning to specific portions of the grid 140, the may only be employed by tools that have the expensive optical scanning devices necessary to detect them. Other tools, such as metrology tools, are not equipped with such circuitry, and thus rely on less accurate alignment techniques. Due to wafer edge profile variations, the grid 140 is not always oriented using a predetermined relationship with respect to the notch or approximate center point. The less expensive techniques that align based on an external reference point (e.g., the approximate center of the wafer 100 or the notch 110) can only approximate the relationship between the grid 140 and the external reference point. Hence, because the operations performed by the tools employing an external reference point are less accurately aligned, the results provided by the tool may be less accurate or repeatable.

The present invention is directed to overcoming, or at least reducing the effects of, one or more of the problems set forth above.

SUMMARY OF THE INVENTION

One aspect of the present invention is seen in a method for aligning wafers. The method includes defining a grid on a wafer; determining a grid offset parameter based on an offset between the grid and an external reference point defined on the wafer; and aligning the wafer based on the grid offset parameter and the external reference point.

Another aspect of the present invention is seen in a system for aligning wafers including a database server and a tool. The database server is adapted to store a grid offset parameter associated with a wafer. The grid offset parameter defines an offset between a grid defined on the wafer and an external reference point defined on the wafer. The tool is adapted to align the wafer based on the grid offset parameter associated with the wafer and the external reference point.

BRIEF DESCRIPTION OF THE DRAWINGS

The invention may be understood by reference to the following description taken in conjunction with the accompanying drawings, in which like reference numerals identify like elements, and in which.

Figure 1:
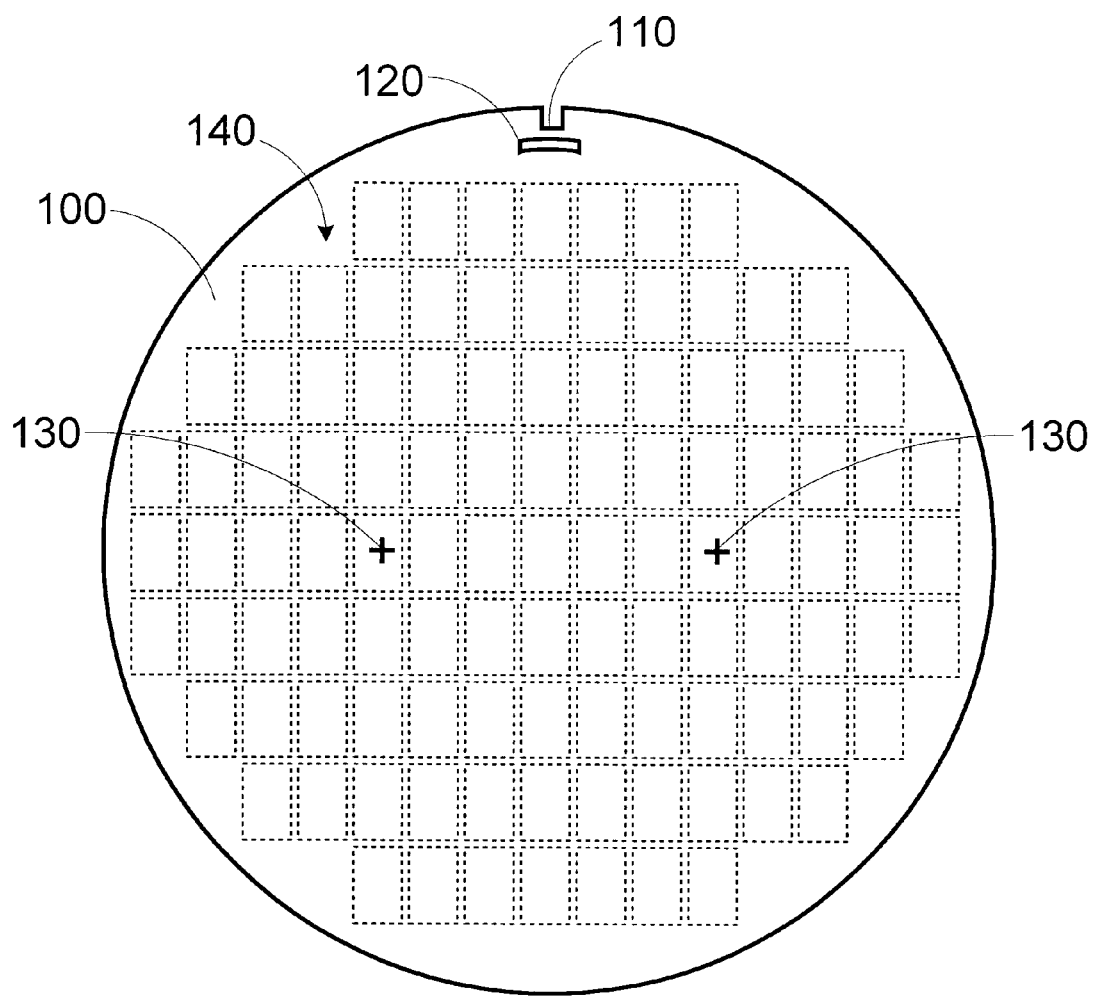
FIG. 1 is a simplified diagram of a prior art semiconductor wafer including grid reference marks.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
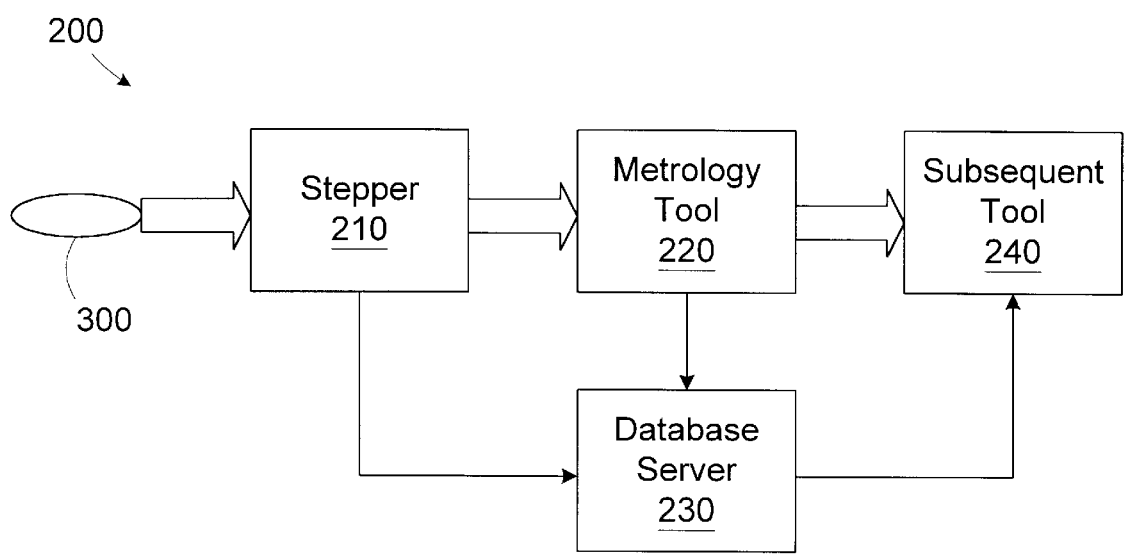
FIG. 2 is a simplified block diagram of a processing line for processing semiconductor wafers in accordance with one illustrative embodiment of the present invention.
Figure 3:
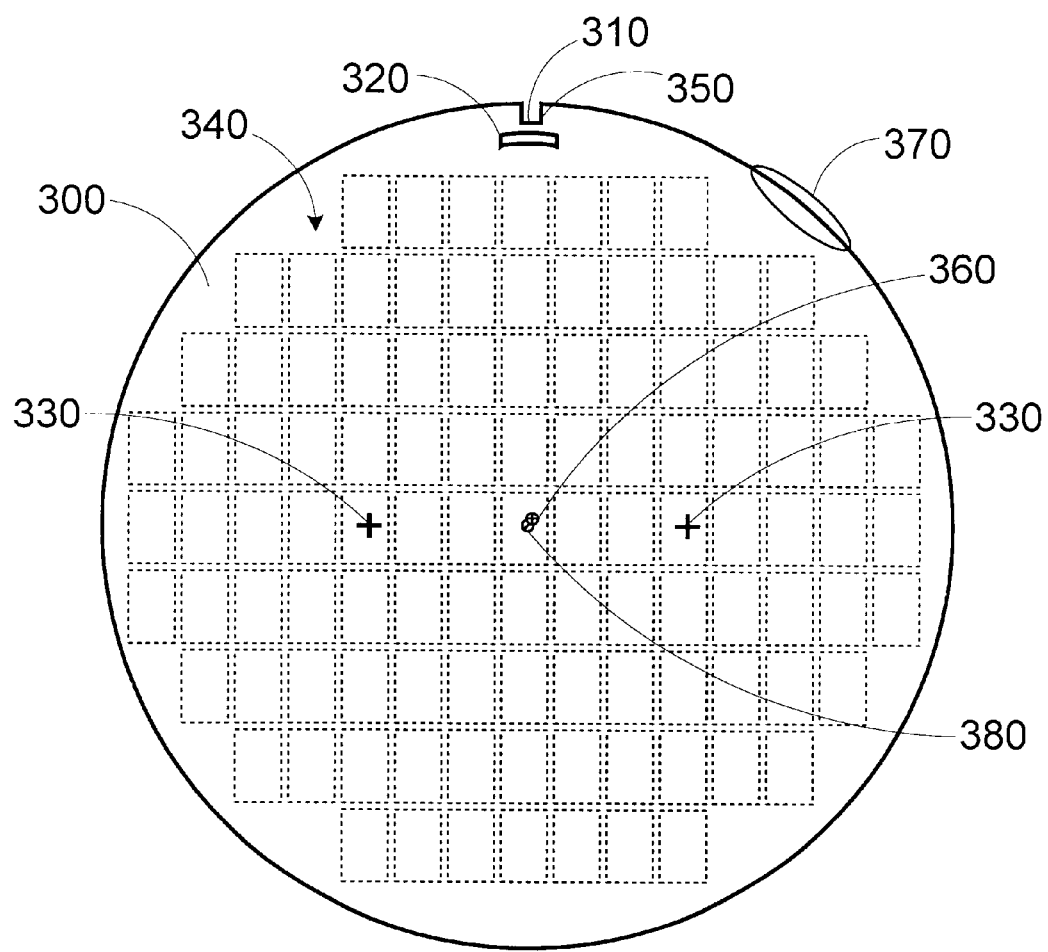
FIG. 3 is a simplified diagram of a semiconductor wafer used in the processing line of FIG. 2.

Turning now to FIG. 2, a simplified block diagram of a processing line 200 for processing semiconductor wafers 300 in accordance with one illustrative embodiment of the present invention is provided. The operation of the processing line 200 is described in reference to the exemplary wafer 300 illustrated in FIG. 3. The wafer 300 includes a conventional orientation notch 310 and wafer identification code 320.

The processing line 200 includes a stepper 210 adapted to pattern the zero layer formed on the wafer 300 to define grid reference marks 330 on the wafer 300 that may be used to reference a grid 340 of cells in which semiconductor die are subsequently formed. To define the grid reference marks 330, the stepper 210 first performs a rough alignment of the wafer using the notch 310 and/or an edge alignment technique. The stepper 210 then places he grid reference marks 330, thus fixing the orientation of the grid 340.

Based on the specific orientation of the grid 340, a grid offset parameter is calculated to define a spatial relationship between the grid 340 and one or more external reference points. As used herein, the term external reference point is directed to a reference point external to the grid defined on the wafer for locating the semiconductor die. The particular external reference point selected for the grid offset parameter may vary, and more than one grid offset parameter may be determined. For example the grid offset parameter may define the spatial relationship between the grid 340 and the notch 310 or an edge 350 of the notch 310. Another grid offset parameter may define the spatial relationship between the grid 340 and a center point 360 of the wafer 300 determined using an edge alignment technique. Still another grid offset parameter may define the spatial relationship between the grid 340 and a locus of points 370 on the wafer profile, also determined using an edge alignment technique (i.e., based on a characteristic shape of a portion of the edge profile).

The particular point on the grid 340 used as the starting point for determining the grid offset parameter(s) may also vary. For example, the offset may be measured from one of the grid reference marks 330, from a center point 380 of the grid 340, or from some other point on the grid 340.

The grid offset parameter(s) may be determined by the stepper 210 if it is equipped to place the grid 340 using a predetermined spatial offset from its rough alignment point(s). Alternatively, the wafer 300 may be transferred to a metrology tool 220 adapted to optically scan the wafer and calculate the desired grid offset parameter(s). The grid offset parameter(s) for each wafer 300 are stored in a database server 230 indexed by its unique wafer identification code 320.

A subsequent tool 240 (e.g., metrology tool or processing tool) in the processing line 200, that is typically limited to using a rough alignment technique, may access the database server 230 to retrieve the grid offset parameter(s) associated with the particular wafer 300 it is processing. After performing its rough alignment process, the subsequent tool 240 may use the grid offset parameter(s) to more accurately reference a particular location on the grid 340 when performing its particular task.

For example, consider the case where the subsequent tool 240 is a metrology tool adapted to measure the thickness of a process layer formed on the wafer 300 at a particular location. The subsequent tool 240 may want to measure the thickness of the process layer in a first cell near the center of the wafer 300 and a second cell nearer the periphery of the wafer 300. Because the measured thickness may vary depending on the underlying topology of the previously formed features, it is desirable to measure the thickness at the same relative position within each cell. Using only a rough alignment technique, the subsequent tool 240 may not be able to accurately identify the corresponding locations within the cells because the particular location of the grid 340 relative to the external feature used for the: rough alignment may vary for each wafer 300.

Furthermore, if the same measurement is to made for a plurality of wafers, the corresponding grid locations for each wafer will not match. This mismatch introduces measurement noise and reduces the repeatability of the process performed by the subsequent tool 240. However, by employing the grid offset parameter(s) associated with the particular wafer 300 being processed, the subsequent tool 240 may improve the accuracy at which it can reference particular points within the grid 340, thus improving the reliability, accuracy, and repeatability of the operation it performs.

In particular example, consider a grid offset parameter defined by the offset between the actual center point 380 of the grid 340 and the center point 360 of the wafer 300 determined using an edge alignment procedure. An exemplary grid offset parameter may be defined by an X offset of 100 microns and a Y offset of 250 microns. Using the design dimensions of the grid 340, the subsequent tool 240 may perform its rough alignment to determine the center point 360 of the wafer 300 and then apply the grid offset parameter to accurately determine a particular position within the grid 340 for each wafer processed.

Figure 4:
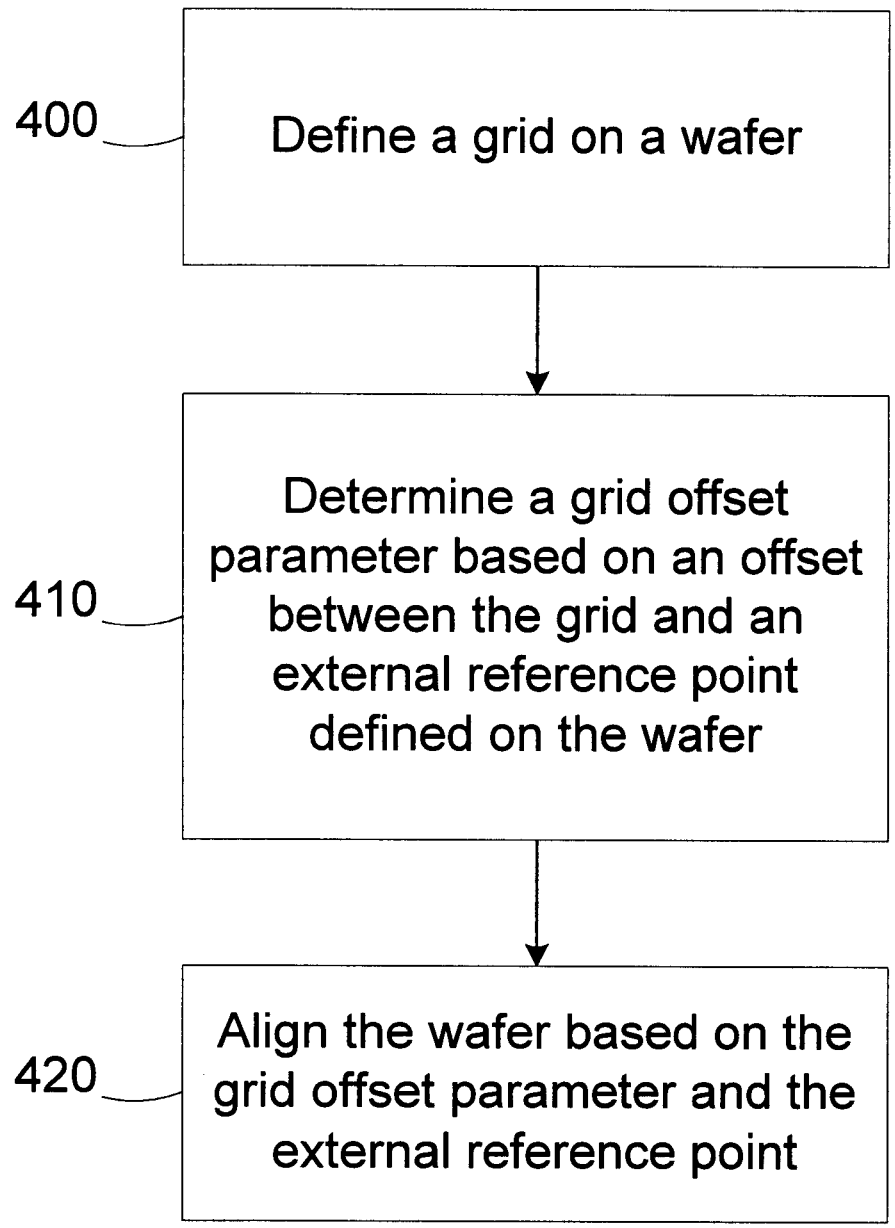
FIG. 4 is a simplified flow diagram of a method for aligning wafers in accordance with another illustrative embodiment of the present invention.

Turning now to FIG. 4, a simplified flow diagram of a method for aligning wafers in accordance with another illustrative embodiment of the present invention is provided. In block 400, a grid is defined on a wafer 300. In block 410, a grid offset parameter is determined based on an offset between the grid and an external reference point defined on the wafer. In block 420, the wafer is aligned based on the grid offset parameter and the external reference point. Subsequent processing and metrology tools may access the grid offset parameter for a particular wafer from a central data store and use the external reference point in conjunction with the grid offset parameter to more accurately align the wafer than possible with the external reference mark alone.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for aligning wafers, comprising: defining grid on a wafer;

determining a grid offset parameter based on an offset between the grid and an external reference point defined on the wafer and being external to the grid; and aligning the wafer based on the grid offset parameter and the external reference point.

2. The method of claim 1, further comprising:

storing the grid offset parameter indexed by a wafer identification code associated with the wafer.

3. The method of claim 1, wherein the grid includes a grid reference mark, and determining the grid offset parameter comprises determining the offset between the grid reference mark and the external reference point.

4. The method of claim 1, wherein determining the grid offset parameter comprises determining the offset between a grid center point and the external reference point.

5. The method of claim 1, wherein determining the grid offset parameter comprises determining the offset between the grid and an orientation notch defined in the wafer.

6. The method of claim 5, wherein determining the grid offset parameter comprises determining the offset between the grid and an edge of the orientation notch.

7. The method of claim 1, wherein determining the grid offset parameter comprises determining the offset between the grid and a wafer identification code disposed on the wafer.

8. The method of claim 1, wherein determining the grid offset parameter comprises determining the offset between the grid and at least a portion of an edge profile of the wafer.

9. The method of claim 1, wherein determining the grid offset parameter comprises determining the offset between the grid and a wafer center point associated with the wafer.

10. The method of claim 1, wherein determining the grid offset parameter comprises determining the offset between a grid center point and a wafer center point associated with the wafer.

11. The method of claim 1, wherein the wafer includes a plurality of external reference points, and the method further comprises determining a grid offset parameter for each of the plurality of external reference points.

12. A system for aligning wafers, comprising:

a database seer adapted to store a grid offset parameter associated with a wafer, the grid offset parameter defining an offset between a grid defined on the wafer and an external reference point defined on the wafer and being external to the grid; and a tool adapted to align the wafer based on the grid offset parameter associated with the wafer and the external reference point.

13. The system of claim 12, wherein the grid includes a grid reference mark, and the grid offset parameter comprises an offset between the grid reference mark and the external reference point.

14. The system of claim 12, wherein the grid offset parameter comprises an offset between a grid center point and the external reference point.

15. The system of claim 12, wherein the external reference point comprises an orientation notch defined in the wafer.

16. The system of claim 15, wherein the external reference point comprises an edge of the orientation notch.

17. The system of claim 12, wherein the external reference point comprises a wafer identification code disposed on the wafer.

18. The system of claim 12, wherein the external reference point comprises at least a portion of an edge profile of the wafer.

19. The system of claim 12, wherein the external reference point comprises a wafer center point associated with the wafer.

20. The system of claim 12, wherein the grid offset parameter comprises an offset between a grid center point and a wafer center point associated with the wafer.

21. The system of claim 12, further comprising a stepper adapted to align the wafer based on the external reference point, define the grid on the wafer, and determine the grid offset parameter.

22. The system of claim 21, wherein the stepper is adapted to form a grid reference mark on the wafer and determine the gird offset parameter based on an offset between the grid reference mark and the external reference mark.

23. The system of claim 12, further comprising a metrology tool adapted to measure an offset between the grid and the external reference mark to determine the grid offset parameter.

24. The system of claim 12, wherein the wafer includes a plurality of external reference points, and the database server is adapted to store a grid offset parameter for each of the associated plurality of external reference points.

25. A system for aligning wafers, comprising;

means for determining a grid offset parameter based on an offset between a grid defined on a wafer and an external reference point defined on the wafer and being external to the grid; and means for aligning the wafer based on the grid offset parameter and the external reference point.

* * * * *